(12) United States Patent
Ko et al.

(10) Patent No.: US 8,269,656 B2
(45) Date of Patent: Sep. 18, 2012

(54) IMPEDANCE MATCHED TRANSMISSION CIRCUIT WITH ANALOG-TO-DIGITAL CONVERTER

(75) Inventors: Isaac Terasuth Ko, Kowloon (HK); Ka Wai Ho, Ma On Shan (HK); Wan Tim Chan, Yuen Long (HK)

(73) Assignee: Supertex, Inc., Sunnyvale, CA (US)

( * ) Notice: Subject to any disclaimer, the term of this patent is extended or adjusted under 35 U.S.C. 154(b) by 20 days.

(21) Appl. No.: 12/786,345

(22) Filed: May 24, 2010

(65) Prior Publication Data

US 2011/0285561 A1    Nov. 24, 2011

(51) Int. Cl.
*H03M 1/00* (2006.01)

(52) U.S. Cl. ........................................ 341/110; 341/155

(58) Field of Classification Search ................... 341/110, 341/155, 156, 161, 158, 159, 120, 138, 118, 341/122, 200

See application file for complete search history.

(56) References Cited

U.S. PATENT DOCUMENTS 7,924,205 B2 *  4/2011  Yoshinaga ..................... 341/161

* cited by examiner

*Primary Examiner* — Joseph Lauture
(74) *Attorney, Agent, or Firm* — DLA Piper LLP (US)

(57) ABSTRACT

An impedance matching transmission circuit for a transducer has a transmission medium connected to the transducer. A transmitting circuit is connected to the transmission medium with the transmitting circuit terminating in a reference circuit element. The transmitting circuit comprises an analog to digital converter having an analog input connected to the reference circuit element, and having a digital output. A digital to analog converter receives the digital output and generates an analog output signal in response thereto. A driver circuit is connected to the transmission medium and receives the analog output signal and supplies a driver signal to the transmission medium.

5 Claims, 5 Drawing Sheets

IMPEDANCE MATCHED TRANSMISSION CIRCUIT WITH ANALOG-TO-DIGITAL CONVERTER

TECHNICAL FIELD

The present invention relates to a transmission circuit with an analog-to-digital converter that has matched impedance. More particularly, the present invention relates to an ultrasound transmission circuit.

BACKGROUND OF THE INVENTION

Impedance matching is widely used in the transmission of signals in applications such as industrial, communication, video, medical and test and measurement markets. For example, impedance matching is used in the transmission of a signal through a co-axial cable for delivery to an ultrasound transducer for use in ultrasound imaging medical devices. Referring to FIG. 1 there is shown a transmission circuit 10 of the prior art for use in ultrasound transmission application. The circuit 10 comprises an ultrasound transmitter 12, which is typically an integrated circuit chip generating a driving signal and supplying it to a back termination resistor 14, which is connected to a co-axial transmission cable 16, which is connected to an ultrasound transducer 20. The transmission cable 16 is typically long (on the order of 2 meters) and is usually a 75 ohm cable. The impedance of the back terminating resistor 14 is matched to that of the cable 16. Thus, the resistor 14 is also on the order of 75 ohms. The use of a resistor 14 having substantially the same impedance as the cable 16 results in maximum signal transfer, and eliminate or minimizes signals reflected from the transducer 20 to reduce or eliminate ringing.

The advantage of using only a back terminated resistor 14 is that it adds only one resistor per driver and the terminating resistor 14 consumes little power. In addition, the series termination adds no dc load to the driver circuit 12 and offers no extra impedance from the signal line to ground. The disadvantage of the use of a resistor 14 connected in series termination fashion is that it is difficult to tune the resistance of the resistor 14 so that the received signal amplitude (after the first reflection) falls within the noise level. In addition, most ultrasound driver circuits 12 are non-linear. Thus, the output impedance would vary with the logic state of the device 12. Furthermore, there can be wide variation in the transmitter chip 12 from one driver circuit 12 to another driver circuit, depending upon the operating temperature range, power supply voltage range and other operating conditions. Thus, it is difficult to select a single value for the resistance of the resistor 14 for all driver circuits 12.

To overcome the foregoing disadvantages, the resistor 14 can be placed in the transmission driver circuit 12, and integrated with the integrated circuit device. Thus, as shown in FIG. 2, there is disclosed another transmission circuit 30 of the prior art in which the matching resistor 14 is added to the driving circuit 12. As a result, the output impedance of the driver circuit 12 can be matched to the transmission media, or the cable 16. Furthermore, the output impedance can be matched for the case where the signal in the driver circuit 12 goes low as well as goes high. However, if the resistor 14 is integrated with the driver circuit 12, the resistor 14 is subject to process variations in the fabrication of the driver circuit 12. For example, current semiconductor processing technology results in process variation of as much as ±30% in variation, resulting in a spread of ±30% in the output impedance of the driver circuit 12 and ±15% in the output voltage.

In another prior art circuit 50 shown in FIG. 3, the circuit 50 uses pre-driver inverter power supplies to switch the output driver circuit 12. The circuit 50 controls the gate-to-source voltage resulting in the linear resistance forced to match the resistance of the external line. The NMOS transistor M2 of the driver circuit 12 is driven from Vlow to Vrn, by the first pre-inverter driver circuit, and the PMOS transistor M1 of the driver circuit 12 is driven from Vrp to Vhi, by the second pre-inverter driver circuit. However, such circuit 50 suffers from difficulty in creating and maintaining the precise voltages required.

SUMMARY OF THE INVENTION

An impedance matching transmission circuit for a transducer comprises a transmission medium connected to the transducer. A transmitting circuit is connected to the transmission medium with the transmitting circuit terminating in a reference circuit element. The transmitting circuit comprises an analog to digital converter having an analog input connected to the reference circuit element, and having a digital output. A digital to analog converter receives the digital output and generates an analog output signal in response thereto. A driver circuit is connected to the transmission medium and receives the analog output signal and supplies a driver signal to the transmission medium.

DETAILED DESCRIPTION OF THE PREFERRED EMBODIMENT

Figure 1:
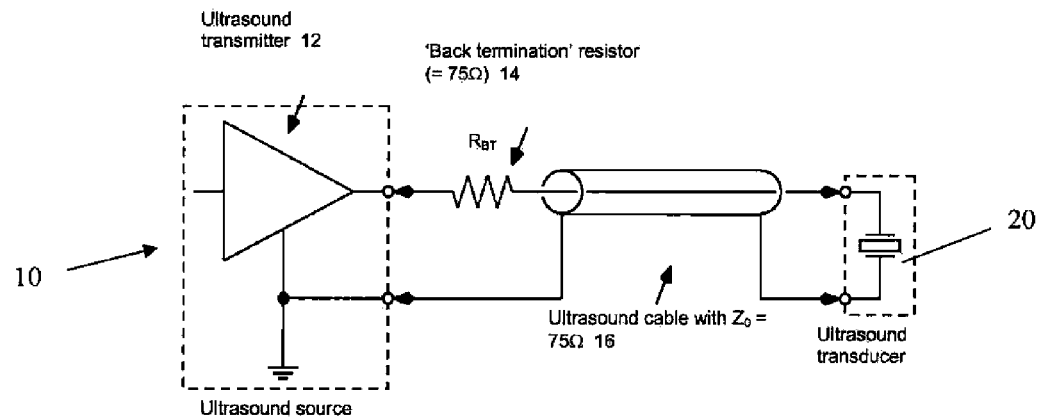
FIG. 1 is a circuit diagram of a first embodiment of a transmission circuit of the prior art.
Figure 2:
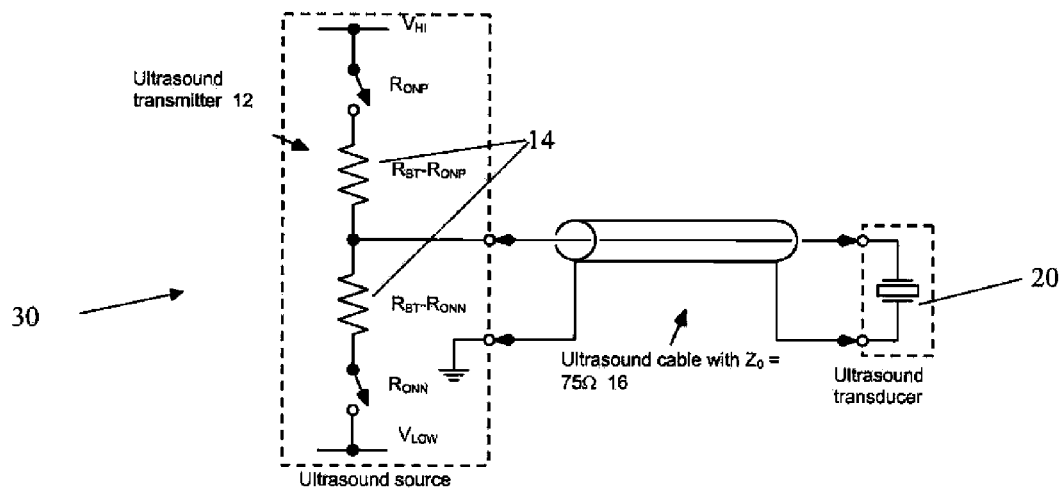
FIG. 2 is a circuit diagram of a second embodiment of a transmission circuit of the prior art.
Figure 3:
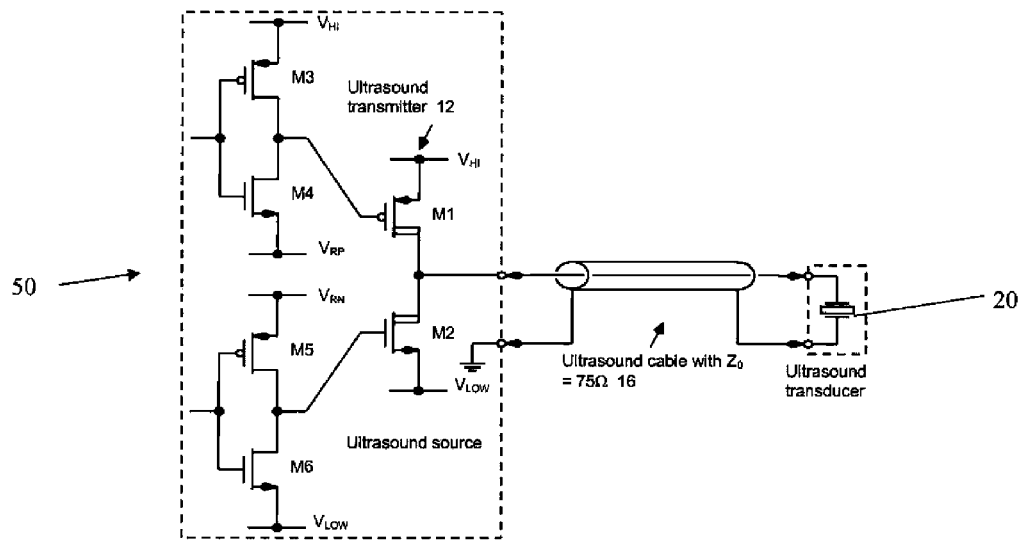
FIG. 3 is a circuit diagram of a third embodiment of a transmission circuit of the prior art.
Figure 4:
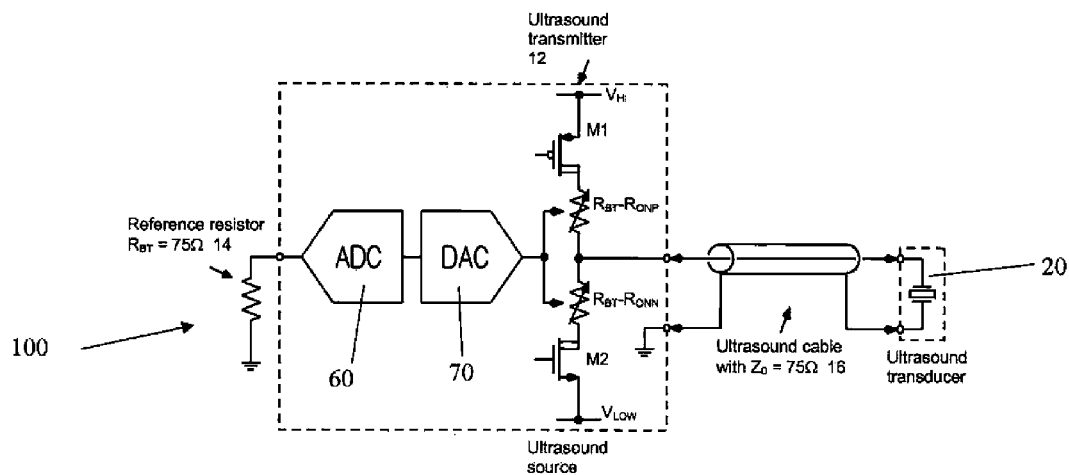
FIG. 4 is a block level diagram of the transmission circuit of the present invention.

Referring to FIG. 4 there is shown a block level diagram of a transmission circuit 100 of the present invention. The circuit 100 has components similar to the circuit 10 shown in FIG. 1, and same numerals will be used for same parts.

The circuit 100 comprises an analog-to-digital converter (ADC) 60, having one end connected to a 75 ohm reference resistor 14. The other end of the reference resistor 14 is connected to ground. The ADC 60 outputs an encoded digital signal which is supplied to a digital-to-analog converter (DAC) 70. The DAC 70 outputs an analog signal which is used to drive a programmable ultrasound transmitter driver circuit 12. The driver circuit 12 supplies an ultrasound transmission signal on a ultrasound cable (typical a coaxial cable with an having an impedance of 75 ohms) 16. The cable 16 terminates at a connection with the ultrasound transducer 20.

Figure 5:
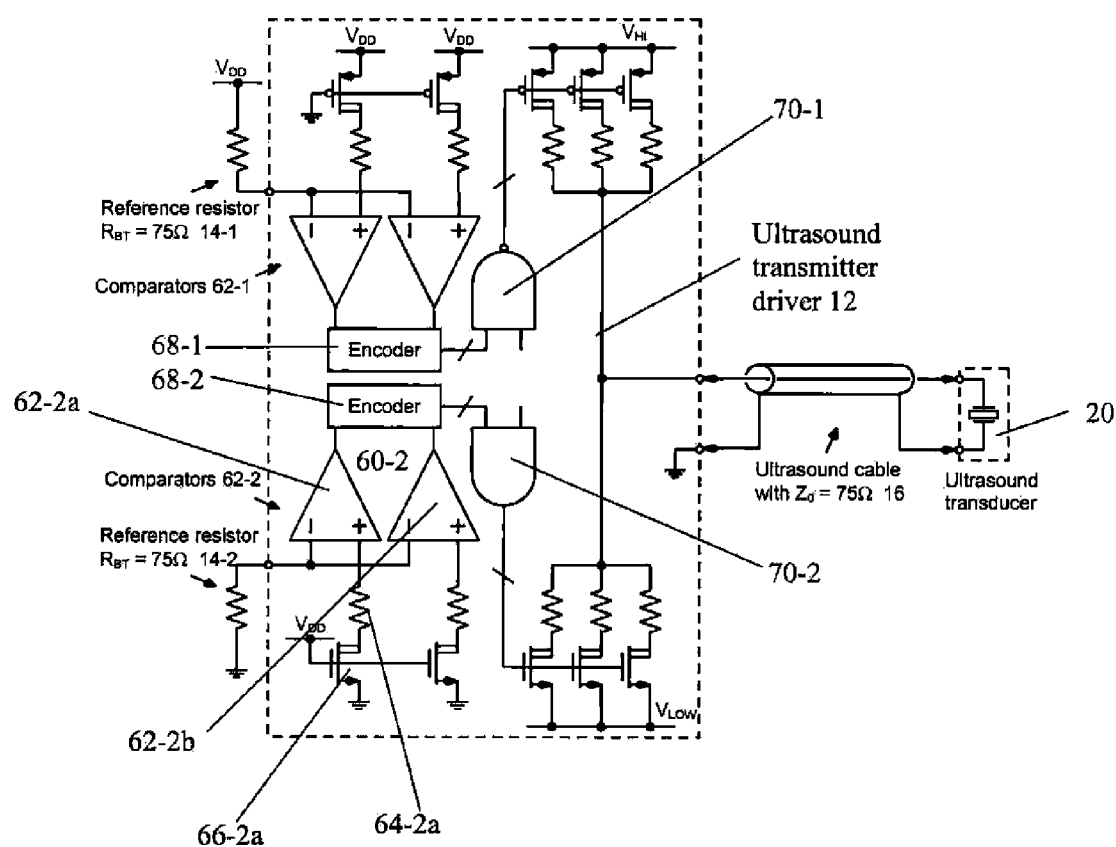
FIG. 5 is a more detailed schematic diagram of the transmission circuit of the present invention shown in FIG. 4.
Figure 6:
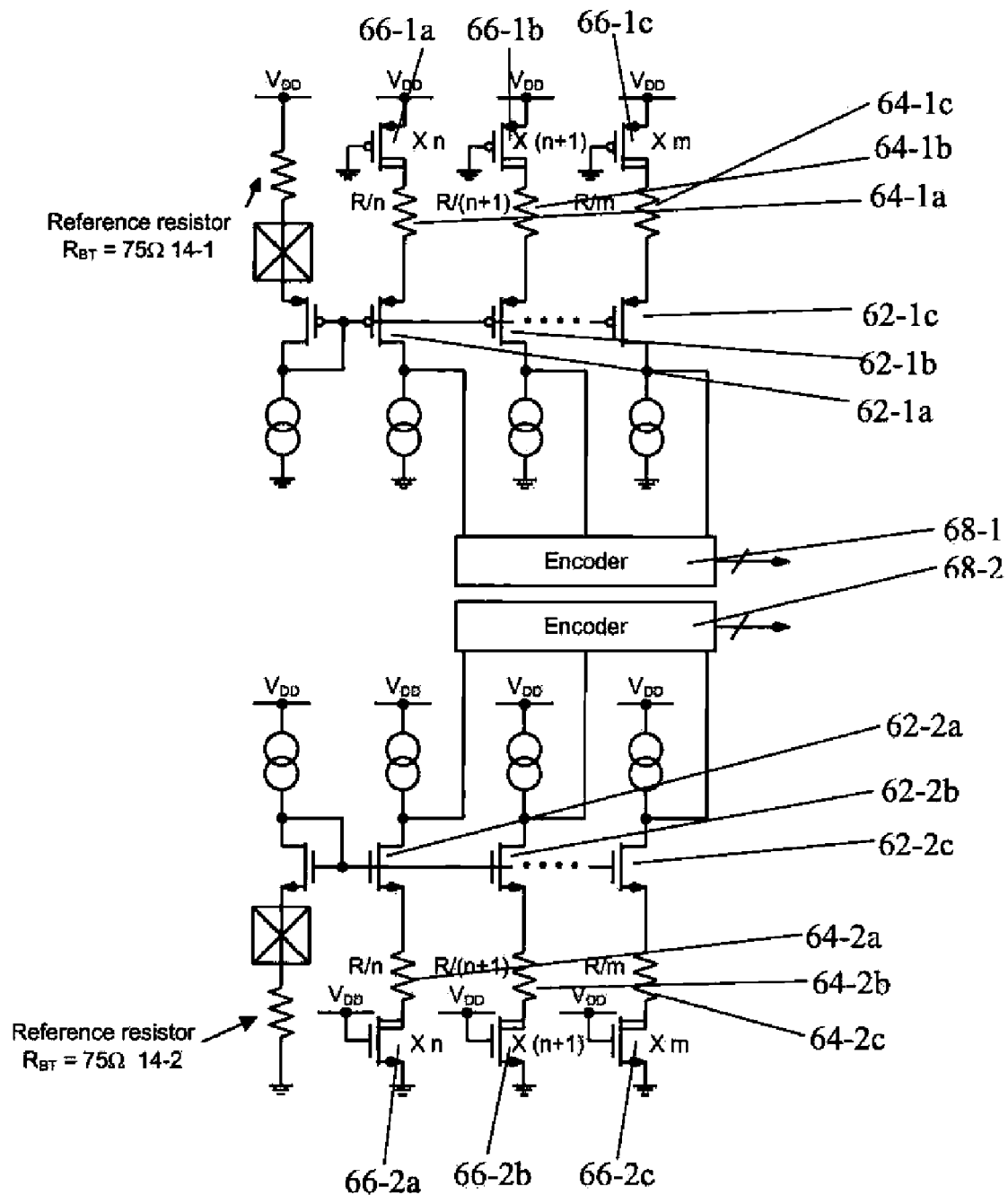
FIG. 6 is a detailed circuit diagram of the analog to digital converter portion of the transmission circuit of the present invention shown in FIG. 5.

Referring to FIG. 5 there is shown a more detailed circuit diagram of the circuit 100 of the present invention. The circuit diagram shown in FIG. 5 shows in greater detail portions of the ADC 60 and of the driver circuit 12. Specifically, the ADC 60 comprises two similar if not identical sets of logic circuits, each with a plurality of comparators 62-1(a-n) and 62-2(a-n) with each comparator 62 having two input leads, and one output lead. A detailed circuit diagram of the ADC 60 is shown in FIG. 6. The inverted input leads of all of the comparators 62 are connected together to one end of the resistor 14. The other end of the resistor 14 is connected to ground. The non-inverted input lead to each comparator 62 is connected to a resistor 64 which is serially connected to a NMOS transistor 66. The resistance of the resistor 64 and the size of the associated NMOS transistor 66 connected to each comparator 62 are different. Thus, as shown in FIG. 6, the resistor 64-2a connected to the comparator 62-2a has a resistance of R/n, while the size of the associated NMOS transistor 66-2a has a size Xn. The resistor 64-2b connected to the comparator 62-2b has a resistance of R/(n+1), while the size of the associated NMOS transistor 66-2b has a size X(n+1). Finally, the resistor 64-2c connected to the comparator 62-2c has a resistance of R/(m), while the size of the associated NMOS transistor 66-2c has a size X(m). The gates of all of the transistors 66-2(a-c) are all connected together to Vdd, while the gates of all of the transistors 66-1(a-c) are all connected together to ground. The source of each transistor 66-2(a-c) is connected to the associated resistor 64-2(a-c) while the drains are all connected to ground. The resistance of the resistors 62-2(a-c) are in a linear relationship, i.e. R/n, r/(n+1), R/(n+2) . . . Rim. The output of each comparator 62-2(a-c) is supplied to an associated encoder 68-2. From the encoder 68-2 (as well as from the encoder 62-1), an encoded digital signal is produced.

Figure 7:
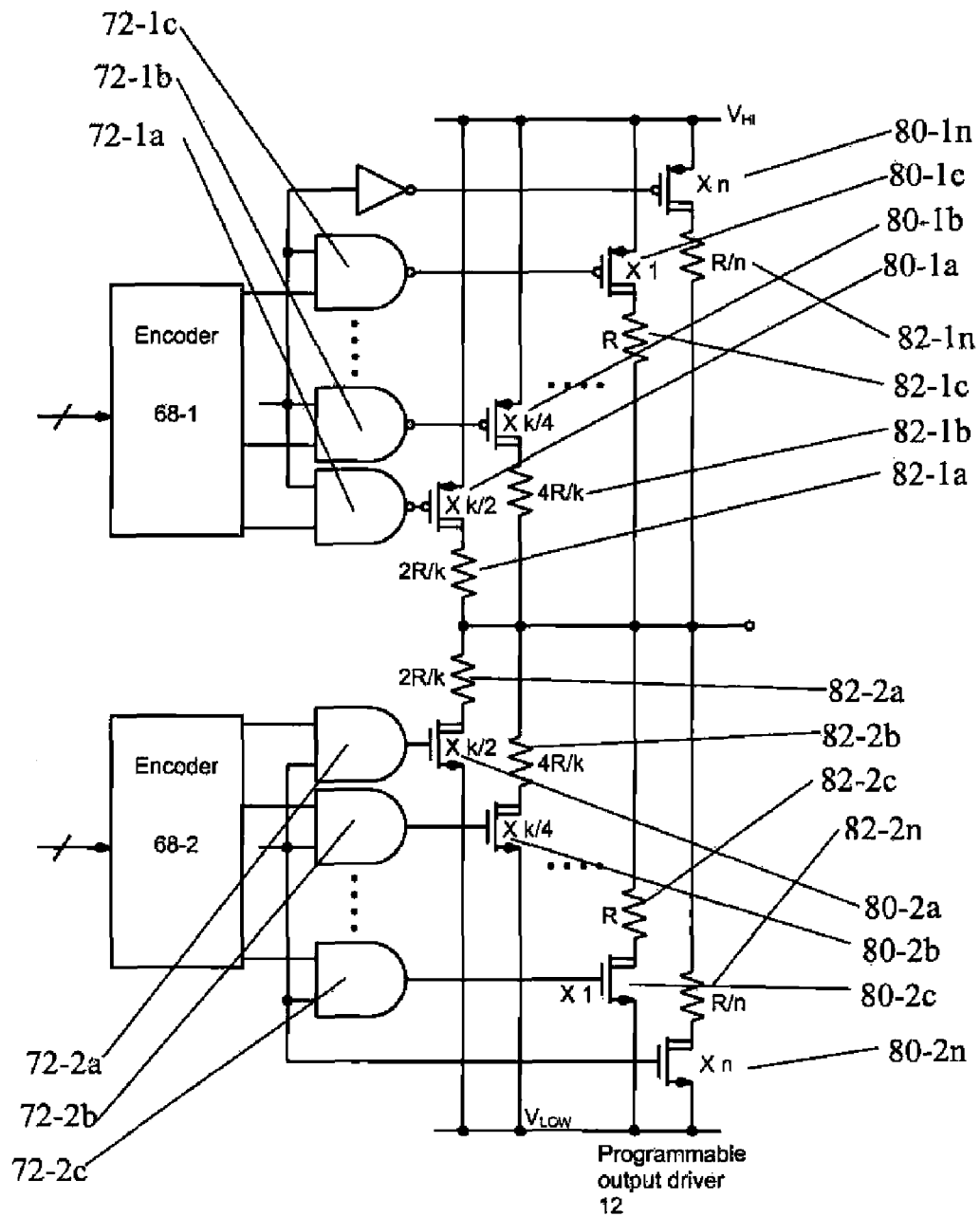
FIG. 7 is a detailed circuit diagram of the digital-to-analog converter portion of the transmission circuit of the present invention shown in FIG. 5.

The encoded digital signal from the encoder 68 is supplied along a bus to the DAC 70. Each DAC 70 comprises a plurality of AND gates 72. Referring to FIG. 7, there is shown in greater detail a circuit diagram of the DAC circuit 70. Each of the AND gates of the DAC 70 has two input leads and one output lead. One of the input leads of each of the AND gates 72 is connected to the encoder 68 to receive a different one of the digitally encoded signals from the encoder 68. The other input lead of all the AND gates 72 are all connected together to either Vdd or ground. This is the common input to all of the AND gates 72. If the connection is to ground, all of the AND gates 72 are turned off. If the connection is to Vdd, all of the AND gates 72 enables the signal from the encoder 68 to be supplied to the programmable driver circuit 12. The output of each of the AND gates 72 is supplied to the gate of a NMOS transistor 80. The source of each of the transistors 80 is serially connected with an associated resistor 82 in the programmable driver circuit 12. Thus, for example, the output of the AND gate 72-2a is supplied to the gate of the NMOS transistor 80-2a, which is serially connected to the resistor 82-2a. The other end, the drain, of the transistor 80-2a are all connected together to a low voltage source, such as ground. The other end of the resistor 82-2a supplies the drive signal to the cable 16. The outputs of the encoder 68-1 are supplied to the NAND gates 72-1(a-c) to which another common input signal is also supplied. The output of the NAND gates 72-1 (a-c) are supplied to the PMOS transistors 80-1(a-n). Each of the PMOS transistors 80-1(a-n) is also connected to an associated resistor 82-1(a-n) at one end and to a high voltage source at another end, which supplies signal to the cable 16.

Similar to the resistor/transistor pair for each of the comparators 62, shown in FIG. 6, the resistor 82/transistor 80 pair connected to the output of each AND gate 72-2 (or NAND gate 72-1) are sized in a proportional manner. Thus, resistor 82a which has a resistance of 2R/k has one half the resistance of the resistor 82b, which has a resistance of 4R/k. Similarly, the NMOS transistor 80-2a, associated with the resistor 82-2a has a size of xk/2, which is twice the size of the NMOS transistor 80-2b, which has a size of xk/4.

In the operation of the circuit 100 of the present invention, assume that the resistor 14 has some variability. The ADC 60 has a plurality of resistor/transistor segments with each segment having a different resistance, and linearly ratioed. The resistance of the resistor 14 is compared to the resistance of the resistors 64 in the segments. For the segments whose resistance of the resistor 64 is lower than the resistance of the resistor 14, the segments will be turned off. For the segments whose resistance of the resistor 64 is higher than the resistance of the resistor 14, the segments will be turned on. This is then encoded into a binary signal by the encoder circuit 68. The encoded binary signal, which is the output of the encoder 68 is then used to turn on the appropriate segment of resistor/transistor in the programmable driver circuit 12. Thus, the impedance imposed on the cable 16 will depend solely on the voltage present on the reference resistor 14. All other factors, such as P and N threshold of the various transistor, temperature, power supply voltage variation etc. will cancel out because they are identical in the resistor/transistor segments of the programmable driver circuit 12 as they are present in the resistor/transistor segments of the comparator 62. The same type of resistors and transistors are used in both circuits (64/66 and 82/80) and result in the resistance and threshold voltages being identical. In addition, the circuits (64/66 and 82/80) are process invariant, as well as being temperature power supply voltage independent. The circuits 64/66 and 82/80, however, are not identical in size and ratios. The resistors/transistors 64/62 are in a linear relationship while the resistors/transistors 82/80 are in a binary relationship. The function of the encoder 68 is to map the linear relationship of the resistor/transistors 64/62 to the binary relationship of the resistors/transistors 82/80.

From the foregoing, it can be seen that with the circuit 100 of the present invention, it has the advantage of using only a terminated resistor 14 by adding only one resistor per driver. Furthermore, it has the advantage of the circuit being immune to the operating temperature range, power supply voltage range and other operating conditions.

What is claimed is:

1. An impedance matching transmission circuit for a transducer, said circuit comprising:
 a transmission medium connected to the transducer;
 a transmitting circuit connected to the transmission medium, said transmitting circuit terminating in a reference circuit element;
 wherein the transmitting circuit comprising:
 an analog to digital converter having an analog input connected to the reference circuit element, and having a digital output;
 a digital to analog converter for receiving the digital output and for generating an analog output signal in response thereto; and
 a driver circuit connected to the transmission medium and for receiving the analog output signal and for supplying a driver signal to the transmission medium;
 wherein said analog to digital converter outputs an encoded digital signal; and
 wherein said analog to digital converter comprises a plurality of comparators, comparing an output signal from the reference circuit element with an output signal from a plurality of reference impedances.

2. The circuit of claim 1 wherein each of said plurality of comparators has a first input connected to the reference circuit element and a second input connected to a reference impedance.

3. The circuit of claim 2 wherein each of said plurality of comparators has an output, and said analog to digital converter further comprises a digital encoder connected to the output of said plurality of comparators and for generating an encoded digital signal in response.

4. The circuit of claim 1 wherein said reference circuit element is a resistor.

5. The circuit of claim 1 wherein said transmission medium is an ultrasound cable.

* * * * *